(12) United States Patent
Iwasaki

(10) Patent No.: US 9,570,276 B2
(45) Date of Patent: Feb. 14, 2017

(54) PROJECTION-TYPE CHARGED PARTICLE OPTICAL SYSTEM AND IMAGING MASS SPECTROMETRY APPARATUS

(71) Applicant: CANON KABUSHIKI KAISHA, Tokyo (JP)

(72) Inventor: Kota Iwasaki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/901,672

(22) PCT Filed: Feb. 26, 2015

(86) PCT No.: PCT/JP2015/056445
§ 371 (c)(1),
(2) Date: Dec. 28, 2015

(87) PCT Pub. No.: WO2015/133558
PCT Pub. Date: Sep. 11, 2015

(65) Prior Publication Data
US 2016/0141162 A1    May 19, 2016

(30) Foreign Application Priority Data

Mar. 3, 2014 (JP) ................................. 2014-040967
Feb. 23, 2015 (JP) ................................. 2015-033378

(51) Int. Cl.
*H01J 49/00* (2006.01)
*H01J 37/252* (2006.01)
(Continued)

(52) U.S. Cl.
CPC .......... *H01J 49/0004* (2013.01); *H01J 37/252* (2013.01); *H01J 49/067* (2013.01);
(Continued)

(58) Field of Classification Search
USPC .................................................. 250/281, 282
See application file for complete search history.

(56) References Cited

U.S. PATENT DOCUMENTS

| 2013/0270432 A1 | 10/2013 | Iwasaki |
| 2014/0239173 A1 | 8/2014 | Iwasaki |
| 2015/0136970 A1* | 5/2015 | Hoyes .................. H01J 49/401 250/282 |

FOREIGN PATENT DOCUMENTS

| EP | 1833076 A2 | 9/2007 |
| EP | 2037260 A1 | 3/2009 |

(Continued)

*Primary Examiner* — Kiet T Nguyen
(74) *Attorney, Agent, or Firm* — Canon U.S.A. Inc., IP Division

(57) ABSTRACT

Provided is a projection-type charged particle optical system in which a projection magnification can be changed while a decrease in the accuracy in measuring a mass-to-charge ratio is being suppressed. A projection-type charged particle optical system according to the present invention includes a first electrode disposed so as to face a sample and having an opening formed therein for allowing a charged particle to pass, a second electrode disposed on a side of the first electrode opposite to where the sample is disposed and having an opening formed therein for allowing the charged particle to pass, and a flight-tube electrode disposed such that the charged particle that has been emitted from the sample and has passed through the second electrode enters the flight-tube electrode and being configured to form a substantially equipotential space thereinside. A principal plane is formed at at least two positions in a travel path of the charged particle.

20 Claims, 9 Drawing Sheets

(51) Int. Cl.
*H01J 49/06* (2006.01)
*H01J 49/16* (2006.01)
*H01J 49/10* (2006.01)
*H01J 49/40* (2006.01)

(52) U.S. Cl.
CPC ............ *H01J 49/10* (2013.01); *H01J 49/164* (2013.01); *H01J 49/40* (2013.01)

(56) References Cited

FOREIGN PATENT DOCUMENTS

JP 2002-116184 A 4/2002
JP 2010-251174 A 11/2010

* cited by examiner

PROJECTION-TYPE CHARGED PARTICLE OPTICAL SYSTEM AND IMAGING MASS SPECTROMETRY APPARATUS

TECHNICAL FIELD

The present invention relates to time-of-flight mass spectrometry apparatuses configured to carry out mass spectrometry by ionizing at least a portion of a sample and measuring the time of flight of the generated ions.

BACKGROUND ART

Imaging mass spectrometry is receiving broad attention as a technique for detecting the distribution of substances within a sample, in the field of pathological studies, drug development, and so on. Typically, in mass spectrometry, a sample is irradiated with a laser beam, an ion beam, an electron beam, or the like so as to be ionized, and the resulting ions are separated in accordance with their mass-to-charge ratios. Thus, a spectrum of detected intensities as a function of the mass-to-charge ratio is obtained. In imaging mass spectrometry, a surface of an object to be measured (sample) is subjected to mass spectrometry two-dimensionally, and a two-dimensional distribution of detected intensities of the substances corresponding to the respective mass-to-charge ratios is obtained. Thus, information on the distribution of the substances at the surface of the sample is obtained. Imaging mass spectrometry enables biomolecules, such as protein, and drug molecules to be identified, and also makes it possible to measure the spatial distribution of such biomolecules and drug molecules at high spatial resolution.

A charged particle beam, such as a laser beam and an ion beam, is used in order to ionize a sample, and such a beam is generally referred to as a primary beam. In addition, an ion generated when an ion beam is used as a primary beam (primary ion beam) is referred to as a secondary ion, and a technique for detecting such secondary ions is known as secondary-ion mass spectrometry (SIMS). Furthermore, matrix-assisted laser desorption/ionization (MALDI) is a known example in which a laser beam is used as a primary beam, and a sample that has been crystallized by being mixed into a matrix is irradiated with a pulsed laser beam so as to be ionized.

A time-of-flight technique, which is suitable for detecting molecules having large mass, such as protein, is often employed for detecting an ionized sample by separating the ionized sample in accordance with the mass-to-charge ratio. In a time-of-flight mass spectrometry apparatus, ions are generated in pulses at a surface of a sample, and accelerated through an electric field; or ions are accelerated in pulses through an electric field in vacuum. Ions travel at different flight speeds in accordance with their mass-to-charge ratios, and thus the mass-to-charge ratio of a given ion can be determined by measuring the time (i.e., time of flight) it takes for the given ion to travel a predetermined distance to reach a detector after being emitted from the sample.

In addition, imaging mass spectrometry includes scanning imaging mass spectrometry and projection-type imaging mass spectrometry.

In scanning imaging mass spectrometry, small regions (the size is dependent on the beam diameter of a primary beam) on a sample are successively subjected to mass spectrometry, and the distribution of substances is reconstructed from the result of the mass spectrometry and the positional information of the small regions. Thus, the spatial resolution is determined by the beam diameter of the primary beam and the positional precision of the scanning primary beam.

In projection-type imaging mass spectrometry, a sample is irradiated with a primary beam so as to be ionized, and a position- and time-sensitive detector detects the time at which a generated ion has reached the detector and the position on the detection surface of the detector which the ion has reached. Furthermore, a projection-type charged particle optical system configured to form an image of the ion on the detector is provided, and thus the mass of the detected ion and the position of the ion on the surface of the sample are detected simultaneously. Accordingly, the spatial distribution of substances contained in the sample can be obtained. The projection-type charged particle optical system is formed by an electrostatic lens, a magnetic lens, or the like.

An electrostatic lens is often used as a projection-type charged particle optical system (PTL1). An electrostatic lens causes ions to converge through an electric field and forms an image of the ions on a detector. The spatial resolution of a projection-type charged particle optical system is determined by the accuracy in determining the positions on the detection surface where the ions have reached (positional resolution), the magnification or the aberration of the charged particle optical system, and so forth.

In the field of pathological studies or drug development, a minute structure in the order of microns needs to be observed when a cell or a microstructure is to be observed. In the meantime, a broader range in the order of millimeters or centimeters needs to be observed when a biological tissue is to be observed. Therefore, it is effective to switch the magnification in such a manner that, in the case of the former, the measurement is carried out in a condition in which the spatial resolution is high (high magnification), and in the case of the latter, the measurement is carried out in a condition in which the spatial resolution is low but the measurement range is broad (low magnification).

CITATION LIST

Patent Literature

PTL1 Japanese Patent Laid-Open No. 2010-251174

Technical Problem

In a projection-type imaging mass spectrometry apparatus, in order to carry out measurements with high magnification and low magnification, a probable technique to employ is to vary the magnification of a projection-type charged particle optical system. A projection-type charged particle optical system is formed by an extraction electrode, an electrostatic lens, and the like, and electric fields generated among the lenses function as a convex lens as a whole. Such a convex lens refracts the trajectory of an ion through one or more electric field(s), and an imaginary refractive plane obtained when such a refractive function of the convex lens as a whole is considered as a single instance of refraction is referred to as a principal plane in the present specification. In addition, voltages to be applied to the extraction electrode, the electrostatic lens, and so on are designed such that an image is formed appropriately by the charged particle optical system as a whole.

When the voltage being applied to the extraction electrode or the electrostatic lens is changed, an electric field present between the extraction electrode and the electrostatic lens changes accordingly, and thus the position of the principal plane in the charged particle optical system can be changed along the axis of the charged particle optical system. For example, when the position of the principal plane is brought closer to the object to be measured (sample), the magnification increases; whereas, the position of the principal plane is brought closer to the detector, the magnification decreases. Such an adjustment corresponds to varying a focal distance of the projection-type charged particle optical system. Therefore, adjusting the voltages as appropriate makes it possible to form an image of ions on the detector and to adjust the magnification in accordance with a change in the position of the principal plane.

In the meantime, in a time-of-flight mass spectrometry apparatus, an ion that has been accelerated through an appropriate electric field formed by an extraction electrode and the like enters a flight-tube electrode that is set to an appropriate potential. The ion then moves uniformly an appropriate distance, and is detected by a detector. Kinetic energy which the ion gains through acceleration is constant regardless of the mass-to-charge ratio of the ion, if the electric field stays constant. At least a portion of the internal space of the flight-tube electrode is a space in which the potential within the space is constant (equipotential space). In the equipotential space, an ion moves uniformly both in its flight direction and in a direction orthogonal to the flight direction.

A reason for securing an equipotential space inside the flight-tube electrode is as follows. A time-of-flight mass spectrometry apparatus utilizes a principle that the flight speeds of ions having the same kinetic energy differ in accordance with their mass-to-charge ratios, and thus it is desirable that the kinetic energy of an ion traveling inside the flight-tube electrode do not change. However, when a potential inside the flight-tube electrode changes, the kinetic energy of the ion also changes, and thus the relationship between the mass-to-charge ratio of the ion and its time of flight changes as well. Consequently, it becomes difficult to obtain an accurate mass-to-charge ratio, and thus it is desirable that the interior of the flight-tube electrode can be treated as a substantially equipotential space in which the potential is substantially constant. In order to set the potential inside the flight-tube electrode to be constant, the potential of the flight-tube electrode itself may be held constant. However, it is necessary to take an influence of a potential outside the flight-tube electrode into consideration as well.

Here, a way to adjust the position of a principal plane PP for changing the magnification of a projection optical system in a conventional time-of-flight projection-type imaging mass spectrometry apparatus (FIG. 2A) will be discussed. In a high-magnification condition (FIGS. 2B and 2D), a strong electric field is present between an extraction electrode 41 and a first projection electrode 42, and a principal plane PPH is generated on a nearby side of the first projection electrode 42 that opposes a flight-tube electrode 45. Meanwhile, in a low-magnification condition (FIG. 2C), a principal plane is moved toward a detector by adjusting respective voltages in such a manner that an electric field present between the first projection electrode 42 and the flight-tube electrode 45 becomes stronger than an electric field present between the extraction electrode 41 and the first projection electrode 42. In this case, spacing between equipotential lines C inside the flight-tube electrode 45 in the low-magnification condition (FIG. 2E) is smaller than that in the high-magnification condition (FIG. 2D). An electric field that leaks into the flight-tube electrode 45 increases as illustrated in FIG. 2E, as compared with the case illustrated in FIG. 2D, and thus the potential inside the flight-tube electrode 45 changes, causing the flight speed of an ion to change. Thus, due to the reason described above, changing the magnification results in a problem in that the accuracy in measuring the mass-to-charge ratio is deteriorated.

As described thus far, the conventional time-of-flight projection-type imaging mass spectrometry apparatus faces a challenge in changing the projection magnification of the projection-type charged particle optical system while suppressing a decrease in the accuracy in measuring the mass-to-charge ratio.

SUMMARY OF INVENTION

The present invention provides a projection-type imaging mass spectrometry apparatus that is capable of measuring a mass-to-charge ratio with high accuracy even when a projection magnification is changed.

A projection-type charged particle optical system according to the present invention includes a first electrode disposed so as to face a sample and having an opening formed therein for allowing a charged particle to pass therethrough, a second electrode disposed on a side of the first electrode that is opposite to where the sample is disposed and having an opening formed therein for allowing the charged particle to pass therethrough, and a flight-tube electrode disposed such that the charged particle that has been emitted from the sample and has passed through the first and second electrodes enters the flight-tube electrode and being configured to form a substantially equipotential space thereinside. A principal plane is formed at at least two positions in a travel path of the charged particle.

With the projection-type charged particle optical system according to the present invention, the mass-to-charge ratio can be measured with high accuracy even when the projection magnification is changed.

Further features of the present invention will become apparent from the following description of exemplary embodiments with reference to the attached drawings.

DESCRIPTION OF EMBODIMENTS

First Exemplary Embodiment

Figure 1A:
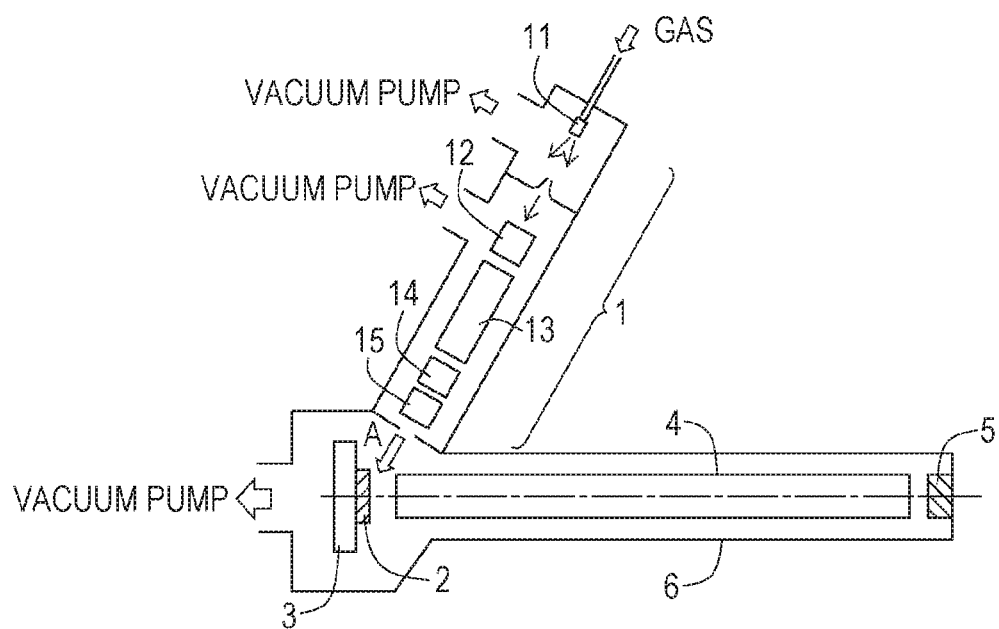
FIG. 1A illustrates a projection-type imaging mass spectrometry apparatus according to the present invention.

A projection-type imaging mass spectrometry apparatus according to an exemplary embodiment of the present invention is illustrated in FIG. 1A.

The projection-type imaging mass spectrometry apparatus according to the present exemplary embodiment includes an ion gun 1 that irradiates a sample 2 with primary ions serving as a primary beam, a sample stage 3 that supports the sample 2, a projection-type charged particle optical system 4 disposed so as to face the sample 2, and a position- and time-sensitive ion detector 5 that detects secondary ions. The ion gun 1, the sample stage 3, the charged particle optical system 4, and the ion detector 5 constitute a vacuum vessel 6. Although not illustrated, the projection-type imaging mass spectrometry apparatus further includes a vacuum pumping system and a signal processing system.

The charged particle optical system 4 and the ion detector 5 constitute a time-of-flight mass spectrometer. An image of charged particles is formed on a surface of the ion detector 5, and the time at which the charged particles, which contain the secondary ions, have been detected is recorded in the ion detector 5.

A cluster-ion gun that supplies cluster ions generated from various types of gases is used as an example of the ion gun 1 according to the present exemplary embodiment. The present exemplary embodiment, however, is not limited thereto, and a liquid-metal ion source, a duoplasmatron, a surface-ionization ion source, or the like may instead be used.

In addition, the source for the primary beam may be a charged particle source that irradiates the sample 2 so as to generate charged particles from the surface of the sample 2, and the primary beam may be an electromagnetic wave, such as a laser beam, or a charged particle beam, such as an ion beam. The charged particle source may be a pulsed charged particle source that generates charged particles from the surface of the sample 2 in pulses, and a pulsed laser-beam source or a pulsed ion source may be used as such a pulsed charged particle source.

The ion gun 1 includes a nozzle 11, an ionization unit 12, a mass selector 13, a chopper 14, and a primary-ion lens 15 (FIG. 1A).

A noble gas (e.g., Ar, Ne, He, and Kr), a molecular gas (e.g., $CO_2$, CO, $N_2$, $O_2$, $NO_2$, $SF_6$, $Cl_2$, and $NH_4$), an alcohol (e.g., ethanol, methanol, and isopropyl alcohol), or water is supplied to the nozzle 11 through a gas-introduction pipe. An acid or a base may be mixed into water or an alcohol. The pressure at which a gas is introduced is not particular limited, and may be in a range from 0.001 atm to 100 atm. Preferably, the pressure may be in a range from 0.1 atm to 20 atm.

When a gas is injected into a vacuum through the nozzle 11, the supplied gas, or a liquid, is accelerated to a supersonic speed. At that time, the gas is cooled through adiabatic expansion; and a gas that contains a cluster, which is an aggregate of atoms or molecules, is generated. At least one of the cluster and the gas enters the ionization unit 12. An electron source, such as a hot filament, is disposed in the ionization unit 12. An atom or a molecule that is contained in the cluster is ionized by an electron emitted from the electron source; and a cluster ion is thus generated.

Cluster ions and monomer ions in various sizes are generated in the ionization unit 12; and such cluster ions and monomer ions are accelerated as appropriate, and then enter the mass selector 13. Thus, a cluster ion beam A having a desired size is generated. The mass selector 13 may be a time-of-flight mass selector, a quadrupole mass selector, or a magnetic mass selector.

The cluster ion beam A is turned into a pulsed cluster ion beam A by the chopper 14. The pulsed cluster ion beam A can also be obtained by using a nozzle through which a gas is injected in pulses or by using an ionization unit that ionizes a cluster in pulses, in place of the chopper 14. The chopper 14 may be capable of operating with a pulse duration of several tens of nanoseconds or shorter at a higher pulse rate.

The acceleration energy of the cluster ion beam A is in a range from several [keV] to several tens of [keV]; however, the acceleration energy may exceed several tens of [keV], to improve the convergence of the primary ion beam or the generation efficiency of the secondary ions.

In the meantime, it is preferable that the acceleration energy per atom or molecule of the cluster ion be no more than 8.3 [eV]. In such a case, the secondary ions can be generated in a condition in which dissociation of an object to be measured in the sample 2 is being suppressed, which enables so-called soft ionization. Thus, the mass of macromolecules, such as protein, can be measured at high sensitivity. Similarly, such effects can be expected that dissociation of a C—H bond, a C—C bond, a C—O bond, and a C—N bond are suppressed if the acceleration energy of the cluster ion per atom or molecule is, respectively, 4.3 [eV], 3.6 [eV], 3.4 [eV], and 2.8 [eV].

Having been accelerated in the manner described above, the pulsed cluster ion beam A is converged as appropriate by the primary-ion lens 15, and is incident on the sample 2. As a result, neutral particles, electrons, and secondary ions are emitted from the surface of the sample 2. While an incident angle at which the cluster ion beam A is incident on the surface of the sample 2 is less than 90 degrees (i.e., parallel to the surface of the sample 2) and no less than 0 degree; when the cluster ion beam A is incident obliquely relative to the surface of the sample 2, the cluster ion beam A can be prevented from colliding with an extraction electrode 41.

Figure 1B:
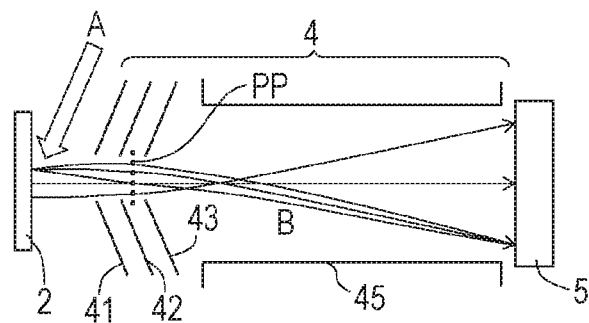
FIG. 1B illustrates a projection-type charged particle optical system according to a first exemplary embodiment.

As illustrated in FIG. 1B, the charged particle optical system 4, which is disposed so as to face the sample 2, includes an extraction electrode 41, a first projection electrode 42, a second projection electrode 43, and a flight-tube electrode 45. The second projection electrode 43 is disposed on a side of the first projection electrode 42 that is opposite to where the sample 2 is disposed. Each of the extraction electrode 41, the first projection electrode 42, the second projection electrode 43, and the flight-tube electrode 45 includes an opening for allowing charged particles to pass therethrough. During operation, an appropriate voltage is applied to each of the extraction electrode 41, the first projection electrode 42, the second projection electrode 43, and the flight-tube electrode 45. In particular, the potential of the extraction electrode 41 relative to the potential of the sample 2 is referred to as an extraction voltage, and an electric field generated therebetween is referred to as an extraction electric field.

Figure 6A:
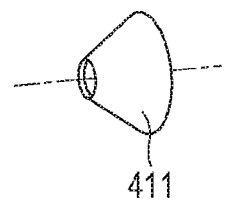
FIG. 6A is a schematic diagram of a conical electrode.
Figure 6B:
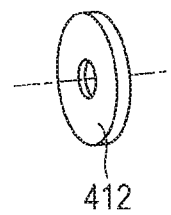
FIG. 6B is a schematic diagram of an aperture electrode.

Any of the extraction electrode 41, the first projection electrode 42, and the second projection electrode 43 may be hollow and conical with an opening formed at the vertex thereof (hereinafter, referred to as a conical electrode 411) (FIG. 6A), may be cylindrical, or may be a planar aperture electrode 412 having an opening formed therein as illustrated in FIG. 6B. In the present exemplary embodiment, a conical electrode is used as each of the first and second projection electrodes 42 and 43, as an example. In particular, if a conical electrode is used as the extraction electrode 41, a portion of the extraction electric field that is spaced apart from the opening in the conical electrode is weaker than another portion of the extraction electric field that is in the vicinity of the opening, which brings about an effect of suppressing deflection of the primary ions through the extraction electric field or variation of the beam shape.

Figure 6C:
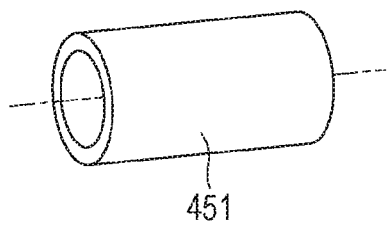
FIG. 6C illustrates a cylindrical flight-tube electrode.
Figure 6D:
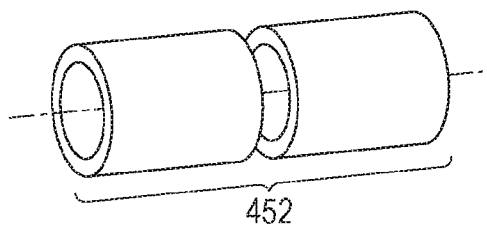
FIG. 6D illustrates a flight-tube electrode that is formed by a plurality of cylindrical electrode.
Figure 6E:
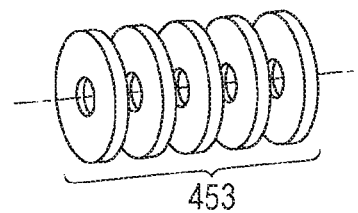
FIG. 6E illustrates another flight-tube electrode that is formed by a plurality of aperture electrodes.

In the present exemplary embodiment, a cylindrical flight-tube electrode 451, which is a cylindrical electrode, is used as the flight-tube electrode 45 (FIG. 6C); however, a multi-cylinder flight-tube electrode 452, which is formed by a plurality of cylindrical electrodes, may instead be used as the flight-tube electrode 45 (FIG. 6D). Alternatively, an aperture flight-tube electrode 453, which is formed by stacking a plurality of aperture electrodes, may be used as the flight-tube electrode 45 (FIG. 6E).

Figure 1C:
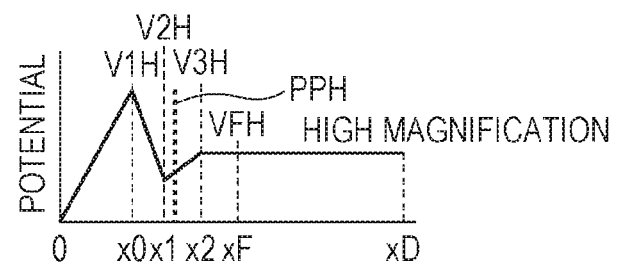
FIG. 1C illustrates potentials of respective electrodes in a high-magnification mode.
Figure 1D:
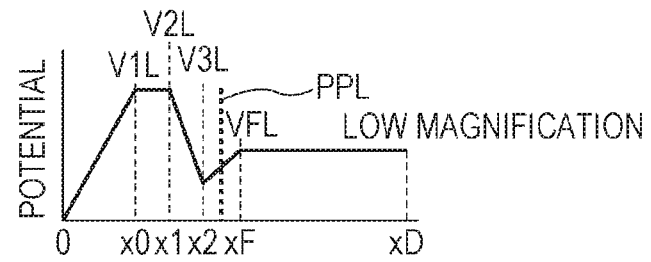
FIG. 1D illustrates potentials of respective electrodes in a low-magnification mode.
Figure 1E:
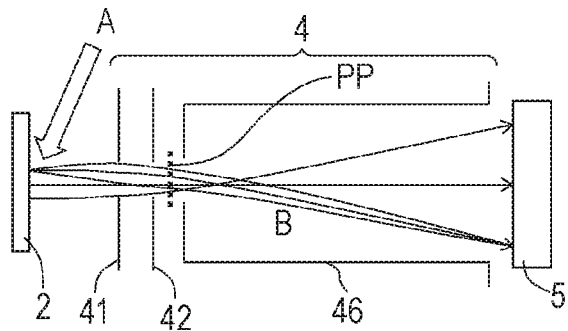
FIG. 1E illustrates a projection-type charged particle optical system that includes an aperture-equipped flight-tube electrode.

As another alternative, an aperture-equipped flight-tube electrode 46, which is formed by connecting the second projection electrode 43 and the flight-tube electrode 45, may be used in place of the second projection electrode 43 and the flight-tube electrode 45 (FIG. 1E). The aperture-equipped flight-tube electrode 46 includes, at an end thereof, a planar portion having an opening formed therein. The aperture-equipped flight-tube electrode 46 exhibits a function that is substantially equivalent to a function obtained by applying equal voltages to the second projection electrode 43 and the flight-tube electrode 45. Although an aperture electrode is used as each of the first and second projection electrodes 42 and 43 in the modification illustrated in FIG. 1E, conical electrodes may instead be used.

The area of a region on the sample 2 that is to be irradiated with the cluster ion beam A (irradiation spot size) may be substantially equal to the size of the opening formed in the extraction electrode 41, or may be greater than the size of the opening. In the latter case, it is advantageous that the area in which the measurement can be carried out can be increased by decreasing magnification without changing the positional relationship between the sample 2 and the charged particle optical system 4.

The secondary ions emitted from the sample 2 are accelerated through the extraction electric field, and enter the charged particle optical system 4. The secondary ions are then converged through electric fields formed by the extraction electrode 41, the first projection electrode 42, and the second projection electrode 43. Thin solid lines B indicate the trajectories of the secondary ions that have been emitted from the sample 2 and reach the ion detector 5 via the charged particle optical system 4. The secondary ions that have passed through the second projection electrode 43 enter the flight-tube electrode 45 having an equipotential space thereinside, and move uniformly therethrough. The secondary ions B that have passed through the flight-tube electrode 45 are detected by the position- and time-sensitive ion detector 5 disposed at an exit of the flight-tube electrode 45. The ion detector 5 transmits, to a signal processing system, the signal intensities of the secondary ions along with the time at which the secondary ions are detected.

The time from when the secondary ions are emitted from the sample 2 to when the secondary ions are detected after having passed through the charged particle optical system 4 (time of flight) can be obtained as a difference between the time at which the secondary ions are generated and the time at which the secondary ions are detected by the ion detector 5. In the present exemplary embodiment, the time at which the cluster ion beam A is incident on the sample 2 can be regarded as the time as which the secondary ions are emitted, and the time of flight of the secondary ions can thus be measured. As a result, the mass-to-charge ratio (m/z) of the secondary ions can be measured, or in other words, mass spectrometry of the secondary ions can be carried out.

In particular, if the flight-tube electrode 45 is sufficiently long in relation to the lengths of the other electrodes, the mass-to-charge ratio of the secondary ions can be obtained approximately as follows. That is, the length of the flight-tube electrode 45 is substituted for L in Equation 1; in a similar manner, the time from when the cluster ion beam A is incident on the sample 2 to when the secondary ions are detected by the ion detector 5 is substituted for t.

[Math. 1]

$$\frac{m}{z} = 2eV\left(\frac{t}{L}\right)^2 \quad \text{(EQUATION 1)}$$

In Equation 1, m represents the mass of an ion; z represents the valence of the ion; V represents the acceleration voltage; and e represents the elementary charge.

When the secondary ions reach the ion detector 5, an image of the secondary ions on the sample 2 is formed on the surface of the ion detector 5 through the convergence effect of the charged particle optical system 4. In other words, a point on the sample 2 is in a correspondence relationship with another point on the surface of the ion detector 5, and thus each point on the sample 2 can be subjected to mass spectrometry. Consequently, imaging mass spectrometry can be carried out. An optical system having such a relationship is referred to as a so-called projection optical system, and a projection optical system is advantageous in that the distribution of substances in a sample can be obtained without scanning the sample with a primary ion beam.

In the present exemplary embodiment, the charged particle optical system 4 has two operation modes, namely, the high-magnification mode and the low-magnification mode. As an example, in the high-magnification mode, voltages V1H, V2H, V3H, and VFH are applied, respectively, to the extraction electrode 41, the first projection electrode 42, the second projection electrode 43, and the flight-tube electrode 45 (FIG. 1C). Meanwhile, in the low-magnification mode, voltages V1L, V2L, V3L, and VFL are applied, respectively, to the extraction electrode 41, the first projection electrode 42, the second projection electrode 43, and the flight-tube electrode 45 (FIG. 1D). The positions of the extraction electrode 41, the first projection electrode 42, the second projection electrode 43, the flight-tube electrode 45, and the ion detector 5 are indicated, respectively, by x0, x1, x2, xF, and xD, with the sample 2 serving as a reference.

A voltage V0 is applied to the sample 2. The value of V0 may be 0 [V] or may be in a range from positive/negative several [V] to positive/negative several tens of [V]. In addition, a voltage Vd having an appropriate potential difference relative to V0 is applied to the secondary ion detection surface of the ion detector 5.

As schematically illustrated in FIG. 1B, a principal plane PP, which indicates the convergence effect of the projection-type charged particle optical system 4 on the secondary ions, is formed in a travel path of the secondary ions and along a plane that is located between the first projection electrode 42 and the second projection electrode 43 and that is orthogonal to the center axes of the openings formed in the first projection electrode 42 and the second projection electrode 43.

As illustrated in FIG. 1C, in the high-magnification mode, the potential difference between V1H and V2H is set to be greater than the potential difference between V2H and V3H. Thus, a first principal plane PPH is formed between the first projection electrode 42 and the second projection electrode 43.

In the meantime, as illustrated in FIG. 1D, in the low-magnification mode, the potential difference between V1L and V2L is set to be smaller than the potential difference between V2L and V3L. Thus, a second principal plane PPL is formed between the second projection electrode 43 and the flight-tube electrode 45.

In other words, with the projection-type charged particle optical system according to the present exemplary embodiment, a principal plane can be formed variably at at least two positions in the travel path of charged particles by setting potentials to be applied to the respective electrodes in each mode.

Ion-optical simulations have been conducted in order to illustrate the above-described relationship in detail (FIGS. 3A, 3B, 3C, 3D, 4A, 4B, and 4C). It is to be noted that calculations are made under the assumption that the ion has a positive charge.

The extraction electrode 41 is disposed at a position that is spaced apart from the surface of the sample 2 by 2 [mm]. The extraction electrode 41 is a conical electrode having a vertical angle of 70 degrees and having an opening formed at the vertex. The opening is 2 [mm] in diameter, and the outer diameter of the extraction electrode 41 is 10 [mm].

The first projection electrode 42 is disposed at a position that is spaced apart from the extraction electrode 41 by 2 [mm]; and the second projection electrode 43 is disposed at a position that is spaced apart from the first projection electrode 42 by 2 [mm]. The shapes of the first projection electrode 42 and the second projection electrode 43 are identical to the shape of the extraction electrode 41. It is to be noted that each of the aforementioned distances between the adjacent electrodes is based on a distance between the corresponding openings.

Furthermore, the flight-tube electrode 45 is disposed at a position that is spaced apart from the second projection electrode 43 by 2 [mm], and the flight-tube electrode 45 is a cylindrical electrode having an inner diameter of 10 [mm] and a length of 50 [mm]. It is to be noted that the extraction electrode 41, the first projection electrode 42, the second projection electrode 43, and the flight-tube electrode 45 are disposed coaxially.

In the high-magnification mode, as an example, V0 of 0 [V], V1H of −4000 [V], and V2H of −500 [V] are applied. In addition, V3H of −1000 [V], VFH of −1000 [V], and Vd of −1000 [V] are applied. In the present exemplary embodiment, a potential difference between the extraction electrode 41 and the first projection electrode 42 is smaller than a potential difference between the sample and the extraction electrode 41. However, a potential difference between the extraction electrode 41 and the first projection electrode 42 may be larger than a potential difference between the sample and the extraction electrode 41. In the high-magnification mode, the potential difference between the extraction electrode 41 and the first projection electrode 42 is larger than a potential difference between the first projection electrode 42 and second projection electrode 43. As indicated by thin solid lines B in FIG. 3A, secondary ions emitted from the sample 2 travel through the charged particle optical system 4, and are then detected by the ion detector 5. FIG. 3B is an enlarged view of the vicinity of the sample 2. The secondary ions are emitted from three points on the sample 2 with emission-angle distribution. It can be seen that the secondary ions emitted from the aforementioned three points are converged at respective three points on the ion detector 5, or in other words, an image of the secondary ions is formed (FIG. 3A).

Figure 3A:
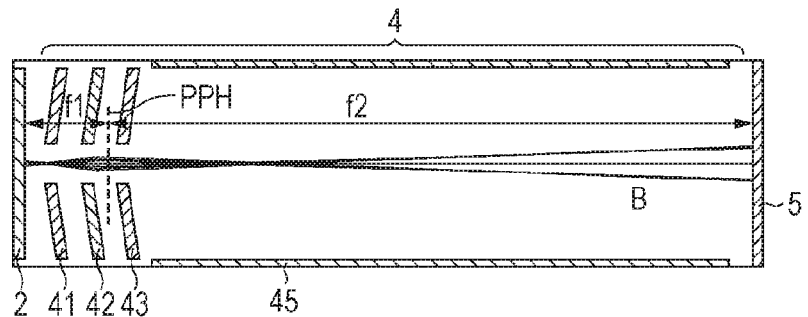
FIG. 3A illustrates a result of an ion-optical simulation in a high-magnification mode according to the first exemplary embodiment.
Figure 3B:
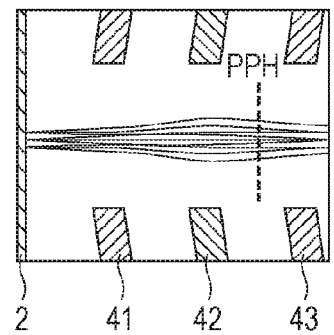
FIG. 3B illustrates the result of the ion-optical simulation in the high-magnification mode, and illustrates the vicinity of a sample.
Figure 3C:
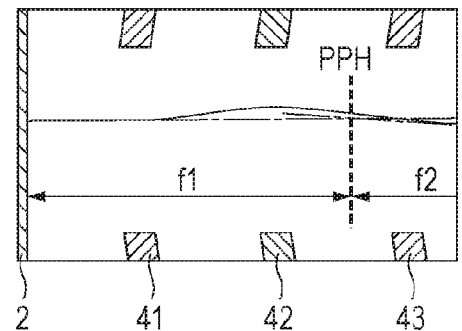
FIG. 3C illustrates the position of a principal plane in the high-magnification mode.
Figure 3D:
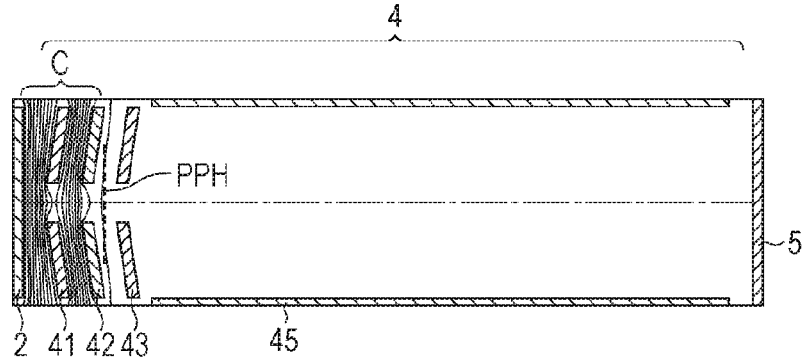
FIG. 3D illustrates a potential distribution in the high-magnification mode.

As illustrated in FIG. 3C, when looking at the trajectory of a secondary ion that has been emitted from the sample 2 in a direction parallel to the optical axis of the charged particle optical system 4 and reaches the ion detector 5, it is possible to draw an asymptote of the stated trajectory extending from the sample 2 and another asymptotic of the stated trajectory extending from the ion detector 5. A point at which a perpendicular that extends from an intersection of the two asymptotes toward the center axis of the charged particle optical system 4 intersects with the center axis is referred to as a principal point. A plane that contains the principal point and that is orthogonal to the center axis is the principal plane. The position of the principal plane can be moved along the center axis by adjusting the voltages to be applied to the respective electrodes. It is to be noted that FIG. 3C illustrates the principal plane PPH in the high-magnification mode.

A projection magnification M of the charged particle optical system 4 can be obtained through Equation 2 on the basis of a distance f1 between the sample 2 and the principal plane and a distance f2 between the principal plane and the surface of the ion detector 5 (FIG. 3A).

[Math. 2]

$$M = \frac{f2}{f1} \quad \text{(EQUATION 2)}$$

In FIG. 3A, f1 is 6 [mm]; f2 is 57 [mm]; and the projection magnification MH in the high-magnification mode is thus 9.5×.

It is to be noted that the distances between given electrodes and the distance between the sample 2 and the charged particle optical system 4 are not limited to the aforementioned values, and may be modified.

Although a configuration may be such that the positional relationship among the electrodes is fixed, the charged particle optical system 4 may be configured such that the distances from the sample 2 to the respective electrodes can be varied.

For example, the distance between the surface of the sample 2 and the extraction electrode 41 may be reduced to 1 [mm] from 2 [mm], and the remaining distances may be set the same as those described above. In such a case, the distance between the principal plane and the sample 2 can be reduced; thus, f1 can be reduced, and f2 can be increased. Consequently, the projection magnification can be increased. Meanwhile, the projection magnification can be reduced by increasing the distance between the surface of the sample 2 and the extraction electrode 41.

Figure 4A:
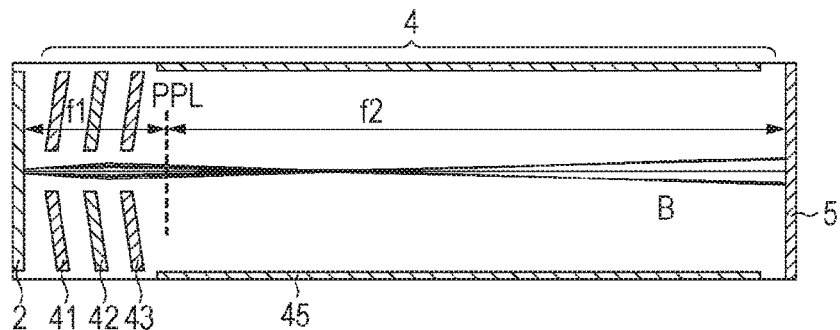
FIG. 4A illustrates a result of an ion-optical simulation in a low-magnification mode according to the first exemplary embodiment.
Figure 4B:
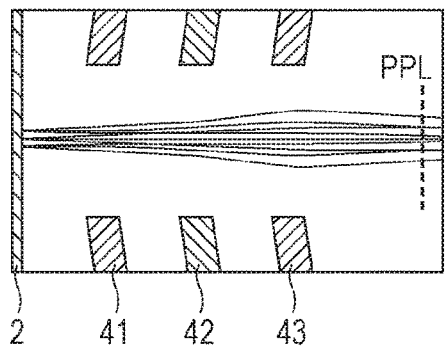
FIG. 4B illustrates the result of the ion-optical simulation in the low-magnification mode, and illustrates the vicinity of a sample.

In the meantime, in the low-magnification mode, V0 of 0 [V], V1L of −4000 [V], and V2L of −4800 [V] are applied. In addition, V3L of −1000 [V], VFL of −1000 [V], and Vd of −1000 [V] are applied. As a result, the potential difference between the extraction electrode 41 and the first projection electrode 42 is smaller than the potential difference between the first projection electrode 42 and second projection electrode 43. As described above, a principal plane PPL is formed between the second projection electrode 43 and the flight-tube electrode 45 (FIG. 4A). Here, f1 is 9 [mm]; f2 is 54 [mm]; and the projection magnification ML in the low-magnification mode is thus 6×.

In both the high-magnification mode and the low-magnification mode, the potential of the flight-tube electrode 45 and the potential of the surface (detection surface) of the ion detector 5 on which an ion is incident may be equal to each other or may be different from each other. In particular, when an ion has a positive charge, the potential of the detection surface may be lower than the potential of the flight-tube electrode 45. In such a case, the ion is accelerated through the electric field generated between the flight-tube electrode 45 and the detection surface, and the kinetic energy of the ion held when the ion is incident on the detection surface increases. This is advantageous in that the sensitivity of the ion detector 5 improves. Meanwhile, the sensitivity improves in a similar manner if the potential of the detection surface is higher than the potential of the flight-tube electrode 45 when an ion has a negative charge.

Figure 4C:
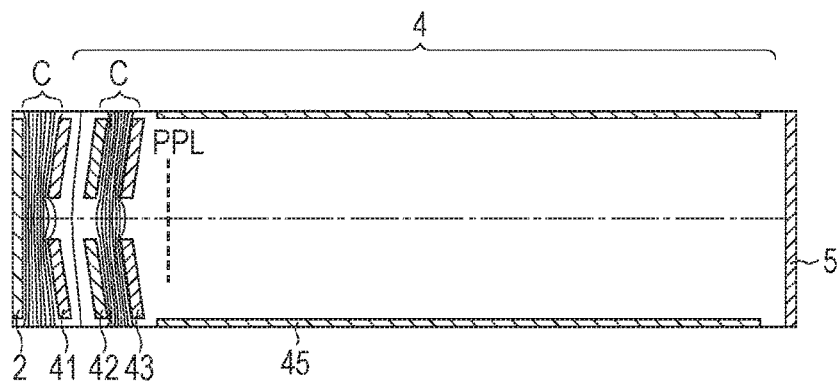
FIG. 4C illustrates a potential distribution in the low-magnification mode.

When looking at the electric field inside the flight-tube electrode 45, spacing between equipotential lines C inside the flight-tube electrode 45 is large in both the high-magnification mode (FIG. 3D) and the low-magnification mode (FIG. 4C). Thus, it can be seen that the space inside the flight-tube electrode 45 is substantially equipotential in both the high-magnification mode and the low-magnification mode. Therefore, even if the projection magnification M is modified by adjusting the voltages to be applied to the respective electrodes, a variation in the time of flight t of secondary ions having the same mass-to-charge ratio is reduced. As a result, an influence on the measured value of the mass-to-charge ratio is suppressed.

When V1L and V1H are set to the same potential as in the present exemplary embodiment, the extraction electric field present between the sample 2 and the extraction electrode 41 substantially does not change. Thus, a variation in the efficiency with which the secondary ions pass through the extraction electrode 41 can advantageously be suppressed. In a similar manner, a variation in the trajectory of the primary ions due to the extraction electric field can advantageously be suppressed as well.

Although VFL and VFH may be set to difference voltages, if VFL and VFH are set to the same potential as in the present exemplary embodiment, the time for which an ion travels through the flight-tube electrode 45 substantially does not change. Therefore, advantageously, a variation in the time of flight t can be substantially ignored. In particular, if the flight-tube electrode 45 is sufficiently long relative to the other electrodes, the time of flight t substantially does not vary even when the projection magnification M is changed. Thus, the accuracy in measuring the mass-to-charge ratio advantageously increases.

Meanwhile, the accuracy in measuring the mass-to-charge ratio is expressed through Equation 3; thus, when the time of flight t changes, mass resolution Δm/m is also affected. Here, Δt represents the accuracy in measuring the time of flight t. As described above, when a variation in the time of flight t decreases, a variation in the mass resolution can also be suppressed.

[Math. 3]

$$\frac{\Delta m}{m} = 2\frac{\Delta t}{t} \quad \text{(EQUATION 3)}$$

As described above, the projection-type charged particle optical system that is capable of measuring the mass-to-charge ratio with high accuracy even when the projection magnification is changed can be provided.

Figure 2A:
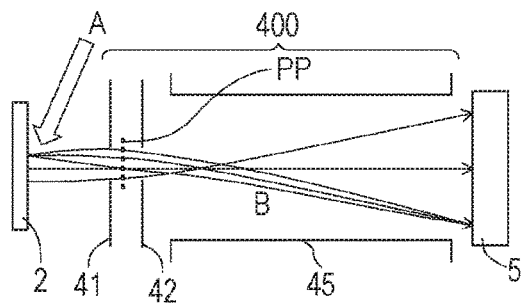
FIG. 2A illustrates a conventional projection-type imaging mass spectrometry apparatus.

Here, an ion-optical simulation of a conventional projection-type charged particle optical system 400 (FIG. 2A) has been conducted for comparison, and the projection-type charged particle optical system 400 consists of the extraction electrode 41, the first projection electrode 42, and the flight-tube electrode 45. Results are illustrated in FIGS. 2B through 2E. The distance between the first projection electrode 42 and the flight-tube electrode 45 is 2 [mm]. Aside from a feature that the second projection electrode 43 is not provided, the shapes and the sizes of the respective electrodes are the same as those in the simulation indicated in FIGS. 3A through 3D.

Figure 2B:
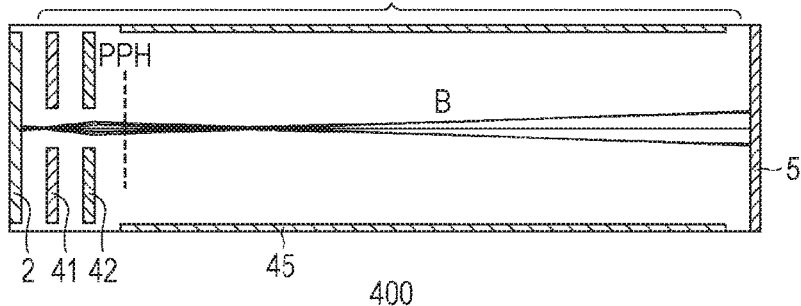
FIG. 2B illustrates a result of an ion-optical simulation in a high-magnification condition.

A result obtained when the projection-type charged particle optical system 400 is operated in the high-magnification mode is illustrated in FIG. 2B. Concerning the voltage settings, V0 of 0 [V], V1H of −4000 [V], and V2H of −520 [V] are applied. In addition, VFH of −1000 [V] and Vd of −1000 [V] are applied. The principal plane PPH is formed between the first projection electrode 42 and the flight-tube electrode 45, and an image of the secondary ions is formed on the ion detector 5.

Figure 2C:
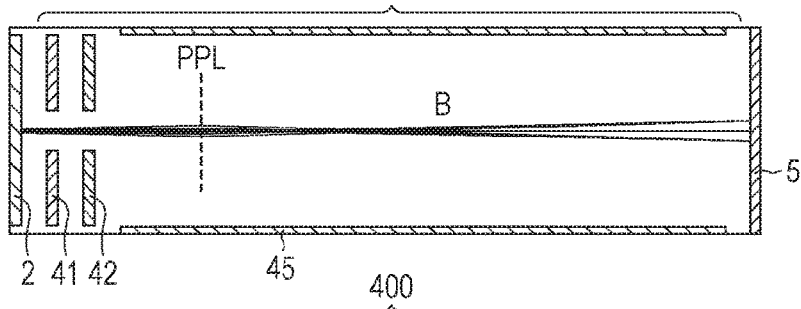
FIG. 2C illustrates a result of an ion-optical simulation in a low-magnification condition.
Figure 2D:
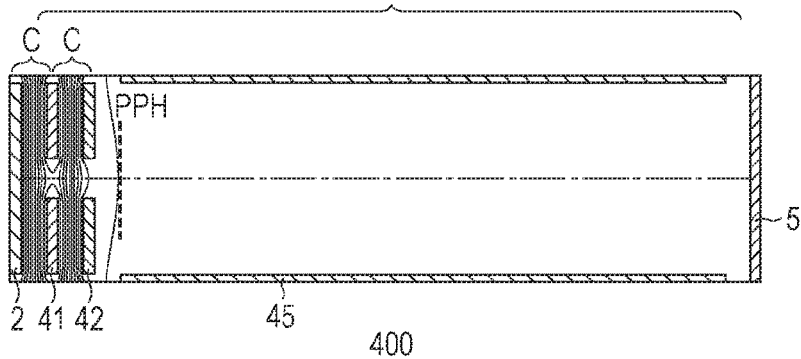
FIG. 2D illustrates a potential distribution in the high-magnification condition.
Figure 2E:
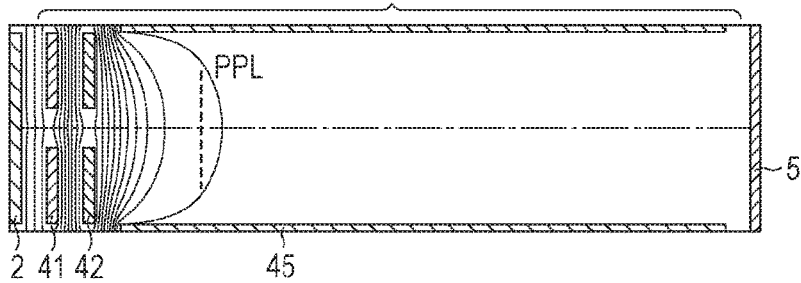
FIG. 2E illustrates a potential distribution in the low-magnification condition.

In the meantime, in order to reduce the magnification, the principal plane PPL is moved toward the ion detector 5 in FIG. 2C. In order to reduce the projection magnification while using the electrodes illustrated in FIG. 2B, the potential difference between the first projection electrode 42 and the flight-tube electrode 45 needs to be set greater than the potential difference between the extraction electrode 41 and the first projection electrode 42. Therefore, V0 of 0 [V], V1L of −4000 [V], V2L of −12500 [V], VFL of −1000 [V], and Vd of −1000 [V] are applied. A comparison of the potential distributions at an entry of the flight-tube electrode 45 reveals that the potential gradient is steeper in the low-magnification mode (FIG. 2E) than in the high-magnification mode (FIG. 2D). Here, smaller spacing of the equipotential lines C is associated with a steeper potential gradient.

Consequently, ions are accelerated or decelerated through the electric field inside the flight-tube electrode 45; thus, the time of flight of the ions varies between the two modes. In other words, in the conventional technique, changing the magnification leads to a variation in the time of flight of the secondary ions inside the flight-tube electrode 45; thus, the conventional technique has such shortcomings that the measured value of the mass-to-charge ratio or the resolution varies.

As described thus far, the conventional projection-type charged particle optical system has shortcomings that changing the projection magnification lead to a decrease in the accuracy in measuring the mass-to-charge ratio. On the other hand, according to the present invention, a variation in the time of flight t of the secondary ions is reduced, which makes it possible to measure the mass-to-charge ratio with high accuracy even when the projection magnification is changed.

Although a cluster ion is illustrated as an example of the primary ion in the present exemplary embodiment, the present invention can also be applied to other charged substances, such as a molecular ion, a fullerene ion, and a charged liquid-droplet. In addition, although the charged particle optical system is used for mass spectrometry of ions in the present exemplary embodiment, the charged particle optical system can also be used for mass spectrometry of other charged particles.

Second Exemplary Embodiment

A projection-type imaging mass spectrometry apparatus according to the present exemplary embodiment is similar to the projection-type imaging mass spectrometry apparatus according to the first exemplary embodiment except for the configuration of a projection-type charged particle optical system.

Unlike the projection-type charged particle optical system 4 according to the first exemplary embodiment, a projection-type charged particle optical system 4 according to the present exemplary embodiment further includes a third projection electrode 44, which is disposed between the second projection electrode 43 and the flight-tube electrode 45. In addition, voltages to be applied to each of the electrodes differ from the voltages in the first exemplary embodiment. The distance between the second projection electrode 43 and the third projection electrode 44 is 2 [mm], and the distance between the third projection electrode 44 and the flight-tube electrode 45 is 2 [mm]. FIGS. 5A through 5F illustrate results of an ion-optical simulation of a projection imaging mass spectrometer according to the present exemplary embodiment.

Figure 5A:
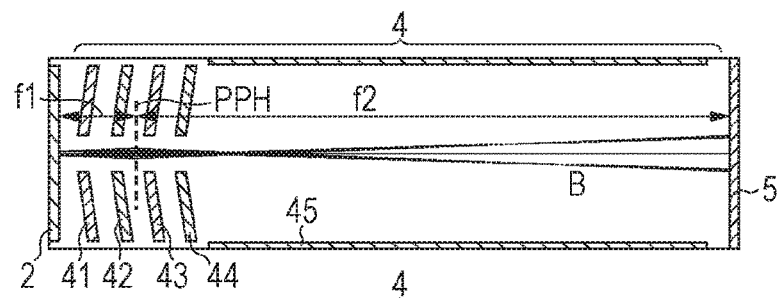
FIG. 5A illustrates a result of an ion-optical simulation in a high-magnification mode according to a second exemplary embodiment.

In the high-magnification mode (FIG. 5A), as an example, V0 of 0 [V], V1H of −4000 [V], and V2H of −570 [V] are applied to the respective electrodes. In addition, V3H of −1000 [V], VFH of −1000 [V], and Vd of −1000 [V] are applied. Furthermore, a voltage V4H of −1000 [V] is applied to the third projection electrode 44. Thin solid lines B in FIG. 5A indicate the trajectories of the secondary ions that have been emitted from the sample 2 and reach the ion detector 5 through the charged particle optical system 4. As in the first exemplary embodiment, it can be seen that the secondary ions are emitted from three points on the sample 2 with emission-angle distribution and converge at respective three points on the ion detector 5. In FIG. 5A, the principal plane PPH is formed between the first projection electrode 42 and the second projection electrode 43 in the high-magnification mode. Here, f1 is 6 [mm]; f2 is 57 [mm]; and the projection magnification MH is thus 9.5×.

Figure 5B:
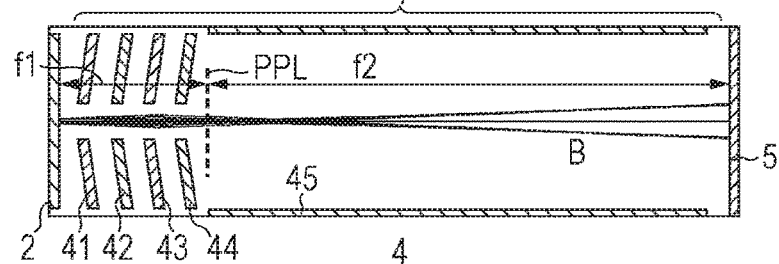
FIG. 5B illustrates a result of an ion-optical simulation in a low-magnification mode.

In the meantime, in the low-magnification mode, as an example, V0 of 0 [V], V1L of −4000 [V], V2L of −4000 [V], and V3L of −3900 [V] are applied. In addition, VFL of −1000 [V] and Vd of −1000 [V] are applied. Furthermore, a voltage V4L of −1000 [V] is applied to the third projection electrode 44. The principal plane PPL is formed between the third projection electrode 44 and the flight-tube electrode 45 in the low-magnification mode. Here, f1 is 11 [mm]; f2 is 52 [mm]; and the projection magnification ML in the low-magnification mode is thus 4.7× (FIG. 5B).

Figure 5C:
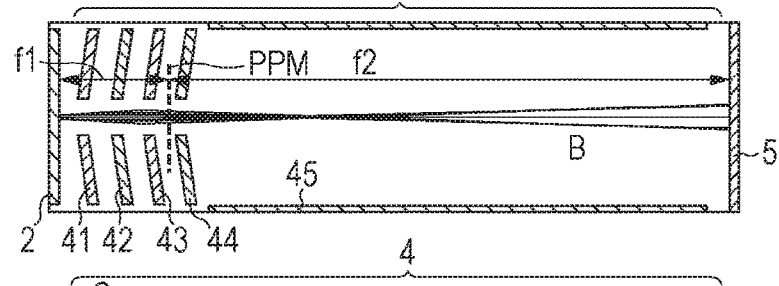
FIG. 5C illustrates a result of an ion-optical simulation in a medium-magnification mode.
Figure 5D:
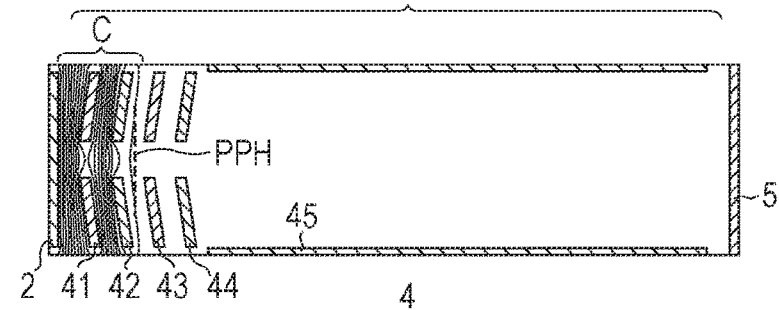
FIG. 5D illustrates a potential distribution in the high-magnification mode.
Figure 5E:
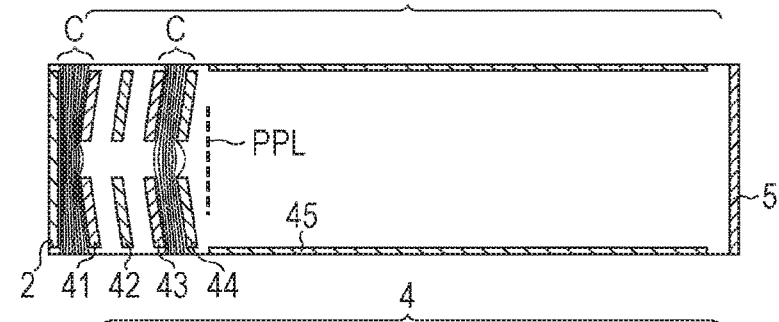
FIG. 5E illustrates a potential distribution in the low-magnification mode.
Figure 5F:
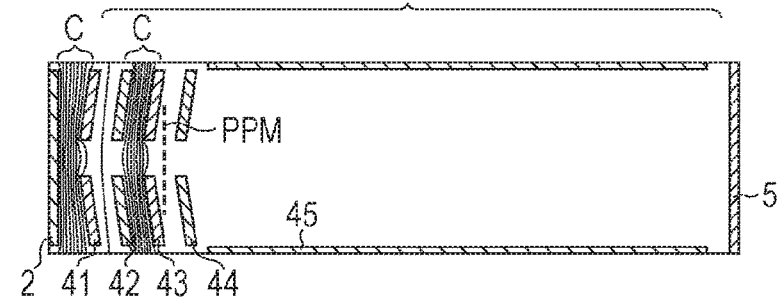
FIG. 5F illustrates a potential distribution in the medium-magnification mode.

Furthermore, in the present exemplary embodiment, another principal plane PPM is formed between the second projection electrode 43 and the third projection electrode 44, and the projection imaging mass spectrometer is thus provided with a medium-magnification mode in which an image of secondary ions is formed with a medium magnification. In the medium-magnification mode, a voltage of 0 [V] is applied to the sample 2; a voltage of −4000 [V] is applied to the extraction electrode 41; and a voltage of −4750 [V] is applied to the first projection electrode 42. A voltage of −1000 [V] is applied to each of the second projection electrode 43, the third projection electrode 44, the flight-tube electrode 45 and the ion detector 5. Here, f1 is 9 [mm]; f2 is 54 [mm]; and the projection magnification in the medium-magnification mode is thus 6× (FIG. 5C).

In any of the high-magnification mode (FIG. 5D), the low-magnification mode (FIG. 5E), and the medium-magnification mode (FIG. 5F), spacing of the equipotential lines C inside the flight-tube electrode 45 is large, and this reveals that the space inside the flight-tube electrode 45 is a substantially equipotential space. Therefore, even if the third projection electrode 44 is added and the projection magnification is thus modified in three levels, a variation in the time of flight t of the secondary ions having the same mass-to-charge ratio is reduced. As a result, the mass-to-charge ratio can be measured with high accuracy.

Although the projection-type charged particle optical system 4 according to the present exemplary embodiment includes three projection electrodes, the projection-type charged particle optical system 4 may include four or more projection electrodes.

In other words, with the charged particle optical system according to the present exemplary embodiment, a principal plane can be formed at at least two positions along the trajectory of the charged particles, and three or more principal planes can be formed.

Third Exemplary Embodiment

Figure 6F:
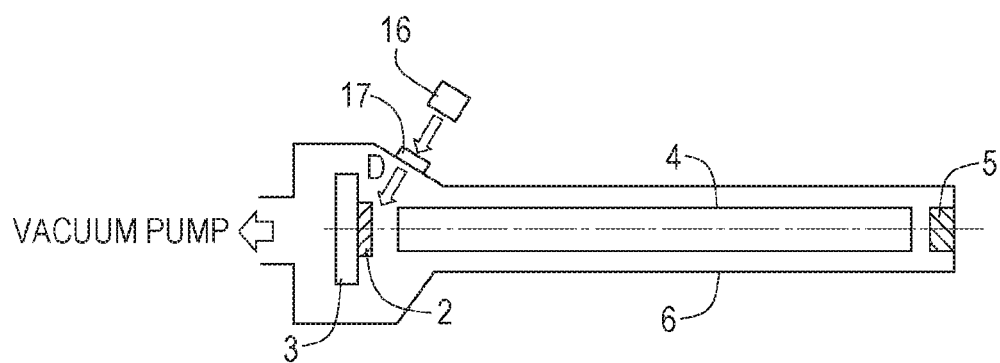
FIG. 6F illustrates a projection-type imaging mass spectrometry apparatus according to a third exemplary embodiment.

A projection-type imaging mass spectrometry apparatus (FIG. 6F) according to the present exemplary embodiment irradiates the sample 2 with a laser beam, which serves as the primary beam. The third exemplary embodiment is similar to the first exemplary embodiment except in that at least a portion of the sample 2 is ionized and that the generated ions are subjected to mass spectrometry.

A laser beam source 16 may be an ultraviolet laser or a visible laser. A laser beam D passes through an optical window 17, and is incident on the sample 2 inside the vacuum vessel 6; thus, ions are emitted from the surface of the sample 2. A matrix agent may be applied to the sample 2.

An image of the ions emitted from the sample 2 is formed on the ion detector 5 by the charged particle optical system 4, as in the first exemplary embodiment. In the present exemplary embodiment, the laser beam D is a pulsed laser beam, and the ions are thus emitted in pulses. Therefore, an interval between the time at which the sample 2 is irradiated with the laser beam D and the time in which the ions are detected by the ion detector 5 corresponds to the time of flight.

In this manner, an image of the ions emitted from the sample 2 that is irradiated with the laser beam D is formed on the ion detector 5, and the time of flight of the ions is measured. Thus, imaging mass spectrometry can be carried out.

With the projection-type imaging mass spectrometry apparatus according to the present exemplary embodiment, the mass-to-charge ratio can be measured with high accuracy even when the projection magnification is changed. In addition, a sample to which a matrix agent has been applied is irradiated with a laser beam, and thus macromolecules, such as a biomolecule, can be detected with high sensitivity.

Fourth Exemplary Embodiment

A projection-type imaging mass spectrometry apparatus according to the present exemplary embodiment is similar to the projection-type imaging mass spectrometry apparatus according to the second exemplary embodiment except for the configuration of a projection-type charged particle optical system.

Figure 6G:
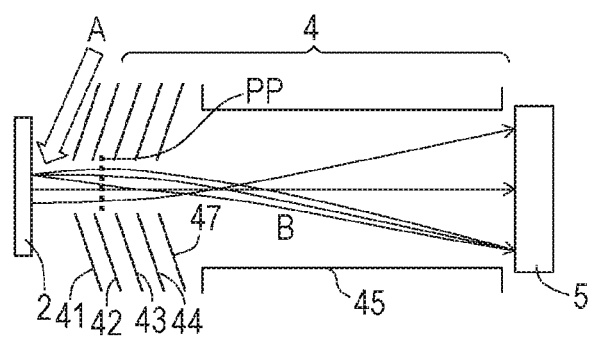
FIG. 6G illustrates a projection-type charged particle optical system according to a fourth exemplary embodiment.

Unlike the projection-type charged particle optical system 4 according to the second exemplary embodiment, as illustrated in FIG. 6G, a projection-type charged particle optical system 4 according to the present exemplary embodiment includes a fourth projection electrode 47, which is disposed between the third projection electrode 44 and the flight-tube electrode 45. In addition, voltages to be applied to each of the electrodes differ from the voltages in the second exemplary embodiment. The distance between the third projection electrode 44 and the fourth projection electrode 47 is 2 [mm], and the distance between the fourth projection electrode 47 and the flight-tube electrode 45 is 2 [mm]. FIGS. 7A through 7D illustrate results of an ion-optical simulation of a projection imaging mass spectrometer according to the present exemplary embodiment.

Figure 7A:
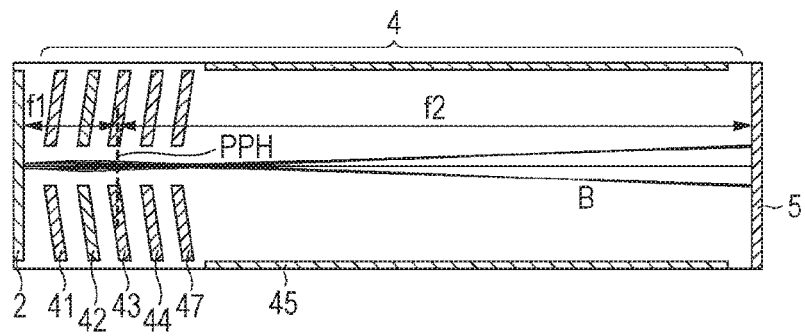
FIG. 7A illustrates a result of an ion-optical simulation in a high-magnification mode according to the fourth exemplary embodiment.

In the high-magnification mode (FIG. 7A), as an example, V0 of 0 [V], V1H of −4000 [V], and V2H of −580 [V] are applied to the respective electrodes. In addition, V3H of −1000 [V], V4H of −900 [V], VFH of −1000 [V], and Vd of −1000 [V] are applied. Furthermore, a voltage V5H of −1000 [V] is applied to the fourth projection electrode 47. Thin solid lines B in FIG. 7A indicate the trajectories of the secondary ions emitted from the sample 2. As in the second exemplary embodiment, it can be seen that the secondary ions are emitted from three points on the sample 2 with emission-angle distribution and converge at respective three points on the ion detector 5. In FIG. 7A, the principal plane PPH is formed between the first projection electrode 42 and the second projection electrode 43 in the high-magnification mode. Here, f1 is 6 [mm]; f2 is 63 [mm]; and the projection magnification MH is thus 10.5×.

Figure 7B:
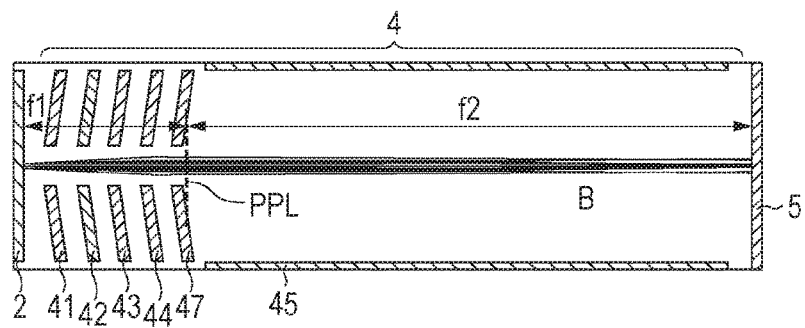
FIG. 7B illustrates a result of an ion-optical simulation in a low-magnification mode.
Figure 7C:
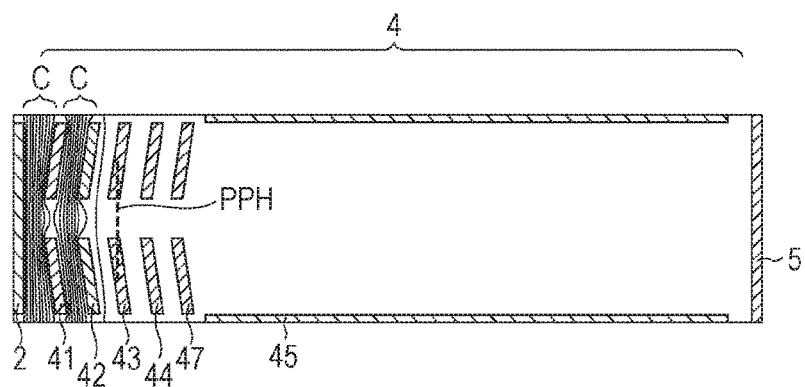
FIG. 7C illustrates a potential distribution in the high-magnification mode.
Figure 7D:
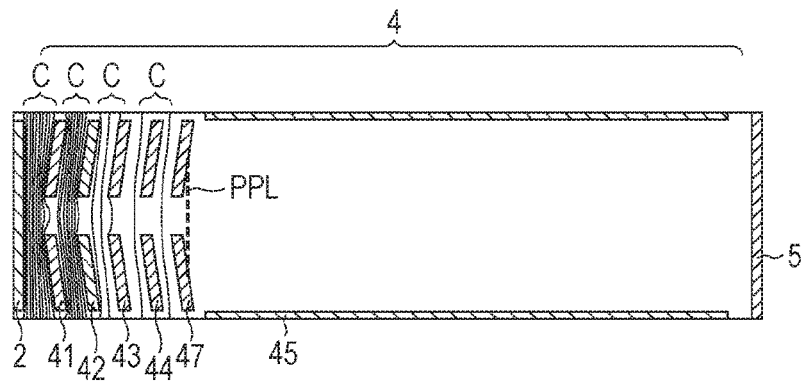
FIG. 7D illustrates a potential distribution in the low-magnification mode.

In the meantime, in the low-magnification mode, as an example, V0 of 0 [V], V1L of −4000 [V], and V2L of −2000 [V] are applied. In addition, V3L of −1000 [V], V4L of −550 [V], VFL of −1000 [V], and Vd of −1000 [V] are applied. Furthermore, a voltage V5L of −1000 [V] is applied to the fourth projection electrode 47. The principal plane PPL is formed between the fourth projection electrode 47 and the flight-tube electrode 45 in the low-magnification mode. Here, f1 is 15 [mm]; f2 is 54 [mm]; and the projection magnification ML in the low-magnification mode is thus 3.6× (FIG. 7B).

One of the features of the present exemplary embodiment is that V3L and V3H do not change even when the high-magnification mode (FIG. 7C) and the low-magnification (FIG. 7D) mode are switched, as described above. Therefore, even when the voltage applied to the first projection electrode 42 is changed, it is possible to reduce an electric field formed by the first projection electrode 42 in a space on a side of the second projection electrode 43 where the third projection electrode 44 is disposed. Meanwhile, even when the voltage applied to the third projection electrode 44 is changed, it is possible to reduce an electric field formed by the third projection electrode 44 in a space on a side of the second projection electrode 43 where the first projection electrode 42 is disposed. Consequently, electric fields for converging the ions can be formed with high accuracy, and the aberration of the electrostatic lens can be reduced. Accordingly, the spatial resolution can advantageously be increased.

The projection-type charged particle optical system 4 also has the medium-magnification mode, as in the second exemplary embodiment, and a second medium-magnification mode can be generated in which a principal plane is formed at a position different from any of the positions where a principal plane is formed in the above-described three modes, by adjusting voltages to be applied to the respective electrodes. In an exemplary case, a voltage that is different from either of V3L and V3H is applied to the second projection electrode 43. In this manner, a principal plane can be formed at at least two positions along the trajectory of the charged particles, and three or more principal planes can be formed.

Although the projection-type charged particle optical system 4 according to the present exemplary embodiment includes four projection electrodes, the projection-type charged particle optical system 4 may include five or more projection electrodes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-040967, filed Mar. 3, 2014 and No. 2015-033378, filed Feb. 23, 2015, which are hereby incorporated by reference herein in their entirety.

The invention claimed is:

1. A projection-type charged particle optical system, comprising:
a first electrode disposed so as to face a sample, the first electrode having an opening formed therein for allowing a charged particle to pass therethrough;
a second electrode disposed on a side of the first electrode, the side being opposite to where the sample is disposed, the second electrode having an opening formed therein for allowing the charged particle to pass therethrough; and
a flight-tube electrode disposed such that the charged particle that has been emitted from the sample and has passed through the first and second electrodes enters the flight-tube electrode, the flight-tube electrode being configured to form a substantially equipotential space thereinside,
wherein a principal plane is formed at at least two positions in a travel path of the charged particle.

2. The projection-type charged particle optical system according to claim 1, wherein at least one of the first and second electrodes is a hollow cone, the opening being located at a vertex of the hollow cone.

3. The projection-type charged particle optical system according to claim 1, wherein a distance from the sample to any of the first and second electrodes and the flight-tube electrode is variable.

4. The projection-type charged particle optical system according to claim 1, wherein a potential difference between the first and second electrodes is smaller than a potential difference between the sample and the first electrode.

5. The projection-type charged particle optical system according to claim 1, further comprising:
a third electrode disposed between the second electrode and the flight-tube electrode, the third electrode having an opening formed therein for allowing the charged particle to pass therethrough.

6. The projection-type charged particle optical system according to claim 5, wherein the projection-type charged particle optical system is provided with a first operation mode in which the potential difference between the first and second electrodes is smaller than a potential difference between the second and third electrodes, and a second operation mode in which the potential difference between the second and third electrodes is smaller than the potential difference between the first and second electrodes.

7. The projection-type charged particle optical system according to claim 5, further comprising:
a fourth electrode disposed between the third electrode and the flight-tube electrode, the fourth electrode having an opening formed therein for allowing the charged particle to pass therethrough.

8. The projection-type charged particle optical system according to claim 7, further comprising:
a fifth electrode disposed between the fourth electrode and the flight-tube electrode, the fifth electrode having an opening formed therein for allowing the charged particle to pass therethrough.

9. The projection-type charged particle optical system according to claim 1, wherein the flight-tube electrode includes a planar member provided at an end thereof, the planar member having an opening formed therein for allowing the charged particle to pass therethrough.

10. A time-of-flight mass spectrometer, comprising:
the projection-type charged particle optical system according to claim 1; and
a position- and time-sensitive detector configured to detect the charged particle that has passed through the flight-tube electrode,
wherein an image of the charged particle is formed on a surface of the position- and time-sensitive detector, and a time at which the charged particle has been detected is recorded in the position- and time-sensitive detector.

11. The time-of-flight mass spectrometer according to claim 10, wherein a potential difference is generated between a detection surface of the position- and time-sensitive detector on which the charged particle is incident and the flight-tube electrode such that kinetic energy of the charged particle increases.

12. A time-of-flight mass spectrometry apparatus, comprising:
the time-of-flight mass spectrometer according to claim 10; and
a pulsed charged particle source configured to generate charged particles from a surface of the sample in pulses.

13. The time-of-flight mass spectrometry apparatus according to claim 12, wherein the pulsed charged particle source is an ion beam.

14. The time-of-flight mass spectrometry apparatus according to claim 13, wherein the ion beam is a cluster ion beam.

15. The time-of-flight mass spectrometry apparatus according to claim 12, wherein the pulsed charged particle source is an electromagnetic wave.

16. The time-of-flight mass spectrometry apparatus according to claim 12, wherein a size of a region on the surface of the sample from which the charged particles are caused to be emitted by the pulsed charged particle source is equal to or greater than a size of the opening formed in the first electrode.

17. A method for projecting a charged particle with a projection-type charged particle optical system that includes a first electrode disposed so as to face a sample and having an opening formed therein for allowing the charged particle to pass therethrough, a second electrode disposed on a side of the first electrode that is opposite to where the sample is disposed and having an opening formed therein for allowing the charged particle to pass therethrough, and a flight-tube electrode disposed such that the charged particle that has been emitted from the sample and has passed through the first and second electrodes enters the flight-tube electrode and being configured to form a substantially equipotential space thereinside, the method comprising;
forming a principal plane at a first position in a travel path of the charged particle; and
forming the principal plane at a second position in the travel path of the charged particle, the second position being different from the first position.

18. The method for projecting a charged particle according to claim 17, wherein a third electrode is further disposed between the second electrode and the flight-tube electrode, the third electrode having an opening formed therein for allowing the charged particle to pass therethrough, and wherein a position at which the principal plane is formed is changed by changing a potential of each of the first, second, and third electrodes.

19. The method for projecting a charged particle according to claim 18, wherein a fourth electrode is further disposed between the third electrode and the flight-tube electrode, the fourth electrode having an opening formed therein for allowing the charged particle to pass therethrough, and wherein the position at which the principal plane is formed is changed by changing a potential of each of the first, second, third, and fourth electrodes.

20. The method for projecting a charged particle according to claim 19, wherein a fifth electrode is further disposed between the fourth electrode and the flight-tube electrode, the fifth electrode having an opening formed therein for allowing the charged particle to pass therethrough, and wherein the position at which the principal plane is formed is changed by changing a potential of each of the first, second, third, fourth, and fifth electrodes.

* * * * *